United States Patent [19]

Marantette et al.

[11] Patent Number: 5,193,949
[45] Date of Patent: Mar. 16, 1993

[54] ARRANGEMENT FOR DRIVING A ROTARY TOOL

[76] Inventors: William F. Marantette, 20624 Earl St., Torrance, Calif. 90503; Roger Johnsrud, 4122 Emerald Ct., No. "H", Torrance, Calif. 90502

[21] Appl. No.: 838,499

[22] Filed: Feb. 19, 1992

Related U.S. Application Data

[63] Continuation-in-part of Ser. No. 660,149, Feb. 22, 1991, abandoned.

[51] Int. Cl.⁵ .................. B23B 47/04; B23B 47/18; B23B 39/08
[52] U.S. Cl. .................................. 408/3; 74/206; 364/474.02; 364/474.28; 377/45; 408/99; 408/126; 408/129; 408/704; 408/10; 408/13; 409/231
[58] Field of Search ............... 74/206; 409/231, 232, 409/186, 187, 193, 194; 408/95, 97-100, 124, 126, 129, 704, 10, 11, 3, 13; 364/474.02, 474.28, 474.34; 377/45, 123, 125, 126; 318/571

[56] References Cited

U.S. PATENT DOCUMENTS

| | | | |
|---|---|---|---|
| 2,850,338 | 9/1958 | Kopczynski | 384/549 |
| 3,183,730 | 5/1965 | Scragg et al. | 409/231 X |
| 3,371,558 | 3/1968 | Asmanes | 408/126 |
| 3,595,096 | 7/1971 | Adler et al. | 74/199 X |
| 3,718,050 | 2/1973 | Verhellen | 57/348 X |
| 3,783,719 | 1/1974 | Gugliotta | 408/3 X |
| 4,219,293 | 8/1980 | Licht | 408/1 R |
| 4,532,643 | 7/1985 | Thompson | 377/45 |
| 4,924,483 | 5/1990 | Cho | 377/45 X |
| 4,985,841 | 1/1991 | Iwagaya | 364/474.02 X |

FOREIGN PATENT DOCUMENTS 16073 2/1977 Japan .................. 408/3

Primary Examiner—Steven C. Bishop
Attorney, Agent, or Firm—Richard F. Carr; Richard L. Gausewitz; Allan Rothenberg

[57] ABSTRACT

An arrangement for driving a rotary tool is provided in which the tool shank is engaged and frictionally driven by the engagement of three or more drive rollers. Axial movement of the tool is accomplished by tilting the axes of the rollers as permitted by flexible portions of the shafts which drive the rollers. The tool is released by moving one roller away from the other two. A pressure foot is provided at the bottom of the assembly reciprocated by a cam arrangement to engage the workpiece when the tool is in operation. A position pick-off senses the axial position of the tool so that the tilt angle of the rollers can be controlled by a dual feedback path servo loop having an improved preconditioning circuit for its feedback position counter.

43 Claims, 11 Drawing Sheets

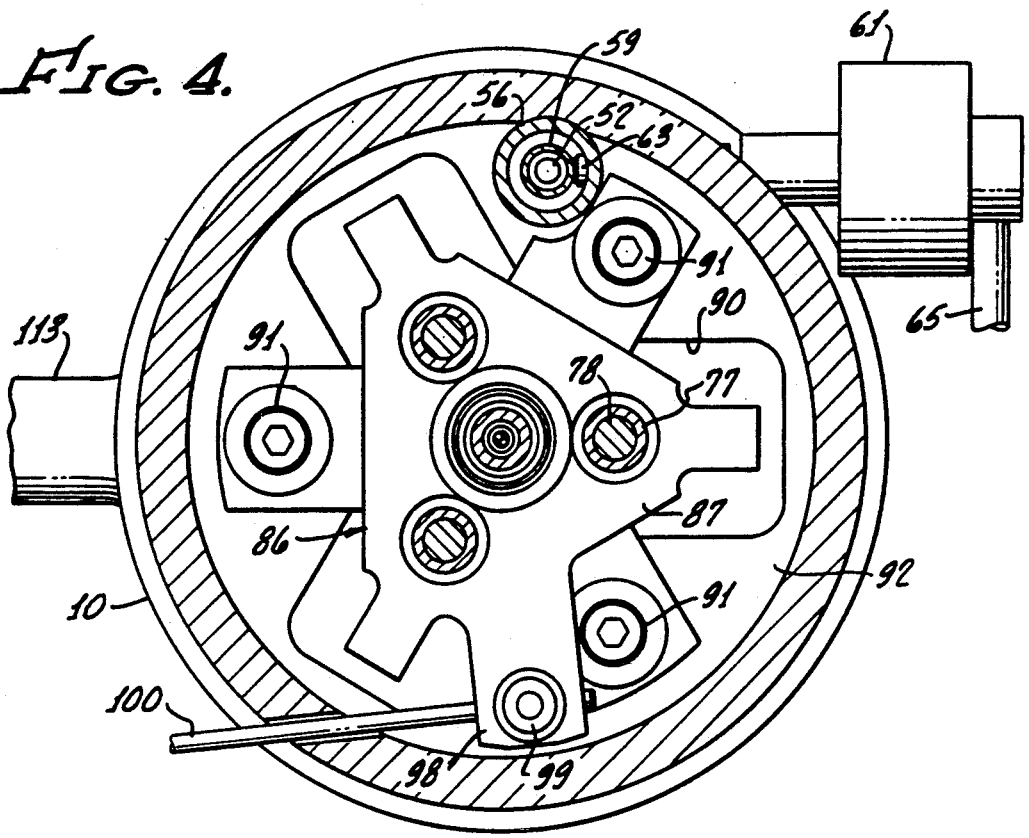
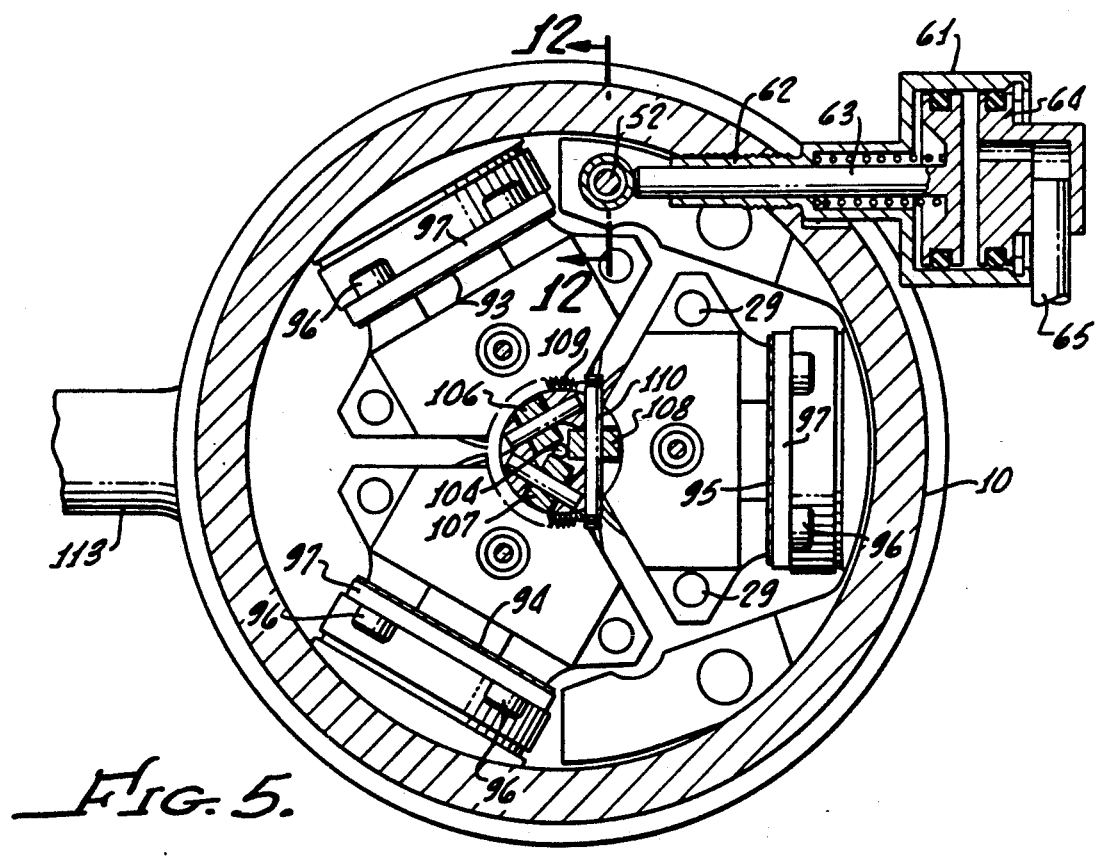

ARRANGEMENT FOR DRIVING A ROTARY TOOL

This application is a continuation-in-part of application Ser. No. 660,149 for ARRANGEMENT FOR DRIVING A ROTARY TOOL, filed Feb. 22, 1991.

BACKGROUND OF THE INVENTION

Drilling machines, especially those for use in producing printed circuit boards, are confronted with demands for ever-increasing rotational speeds. Conventional drill spindles, even those of the most advanced design, have been unable to achieve rotational speeds needed for achieving desired production rates, hole quality and drill life.

The problem of drill rotation speed is especially acute for drills of smaller sizes to produce the kinds of openings increasingly required in printed circuit boards. The machines are called upon to make use of drills of 8 mils diameter and under in producing printed circuit boards. Because of the small drill diameter, the surface speed at the cutting edge is relatively low with conventional spindles. Low surface speed of the drill results in a short drill life and reduced hole quality. Production rates also suffer.

In addition to their inability to rotate drills at optimum speeds, conventional drill spindles are unable to maintain the axes of the drills in precise alignment with the path of movement of the spindle as it reciprocates in the drilling operation. For a drill of relatively large size, a slight cocking is not of major consequence. However, small drills are delicate and are easily broken as a result of even slight angularity of the drill axis relative to the direction of the movement of the spindle. Consequently, in drilling with small drills, breakage of the drills has been a major problem. In an effort to combat this, the manufacturers of drills of small diameter have manufactured the drills of metal which is not as hard as that normally used in drill production, hence being less brittle. Although this may have to a degree reduced drill breakage, it has by no means solved the problem as high rates of drill breakage continue for small drills. Moreover the less brittle material is softer and wears faster, reducing drill life.

Conventional drill spindles are complex and expensive machines. Typically, the drill spindle includes an electric motor within a housing which must be water cooled. Hence, provision is made for circulating water through the spindle assembly. An automatic collet is part of the spindle to enable drill changes to be made. The entire spindle assembly must be reciprocated vertically in order to effect drilling. This requires a large and cumbersome mechanism. The rotor of the spindle must be mounted in precision bearings requiring a long run-in period and with a limited service life.

BRIEF SUMMARY OF THE INVENTION

The present invention provides an entirely new approach to spindle design. It is capable of rotation speeds far exceeding those that can be achieved with existing machines. Rotation at 330,000 rpm is readily attainable. Drills are held in precise alignment with their path of movement so that breakage is no longer a problem, even for very small drills. The mechanism to reciprocate the spindle vertically is eliminated. Instead, the Z-axis motion is obtained by moving the drill alone instead of the spindle mechanism. The spindle is capable of drilling more holes per minute than conventional spindles. Water cooling is not needed. The spindle has a longer life and is quieter in operation than those of prior designs. Also, the spindle of this invention is simpler and can be manufactured more economically than spindles of the prior art. The spindle is more trouble-free, has a longer life, and does not require a run-in period.

These improved results are obtained by providing three rollers to engage and drive the drill shank. The rollers are clustered together to define an opening through which the drill extends and are arranged to provide engagement in two planes. In effect, the three rollers are the same as six rollers, or wheels, arranged in two sets to engage the drill shank at different locations along its length. No conventional collet is provided for the drill, which instead is frictionally driven by the three rollers. In order to move the drill axially, the axes of the rollers are tilted to produce a force component that moves the drill in the axial direction. Tilting in one direction moves the drill down and in the other retracts the drill. The axial movement is quite rapid, particularly in view of the high speeds of rotation.

The rollers are driven by shafts which connect to pulleys which can be rotated by a belt. The rollers are much larger in diameter than the drill shank so that rotating the rollers at a moderate speed produces a much faster rotation of the drill. The shafts for driving the rollers are flexible which allows the tilt of the roller axes.

The axes of rotation of two of the rollers are fixed. The axis of rotation of the third roller is movable. This roller can be moved away from the other two to allow a drill to be released and another to be introduced into the space defined by the rollers. Then the axis of the third roller is shifted back so that this roller presses the drill against all three of the rollers and holds it for the frictional drive.

Different numbers of rollers may be employed for driving the tool. Four rollers, for example, can be positioned in an overlapping relationship so that they can be of larger diameter than is possible with three rollers that engage the tool in the same plane. This will provide greater speed multiplication to drive the tool faster. The rollers need not all be of the same diameter so long as they are rotated at speeds such that the surface speed where the tool is engaged is uniform. In order to obtain maximum torque, it is preferred that all of the rollers are driven so that they contribute to the rotational force imparted to the tool. However, where maximum torque is not essential, such as for drills of extremely small sizes, some of the rollers may be idlers.

Another feature of the invention includes a closed loop dual path control system for driving the tool. A first software one of the control paths includes a processor for modifying the loop control signal according to selected characteristics of the apparatus. The second control path, which can be used either together with or alternatively to the software control path, is a hardware path that eliminates the need for much of the computer controlled processing during operation of the hardware loop. According to another feature of the invention, an unique conditioning circuit is provided for the directional counter of the control loop that employs sensor feedback pulses to generate clock pulses for the counter and that ensures that the counter is set to count in the direction of the later of two closely received opposite directional pulses.

BRIEF DESCRIPTION OF THE DRAWINGS

FIG. 4 is a transverse sectional view taken along line 4—4 of FIG. 3;

FIG. 5 is a transverse sectional view taken along line 5—5 of FIG. 3;

DETAILED DESCRIPTION OF THE INVENTION

Figure 1:
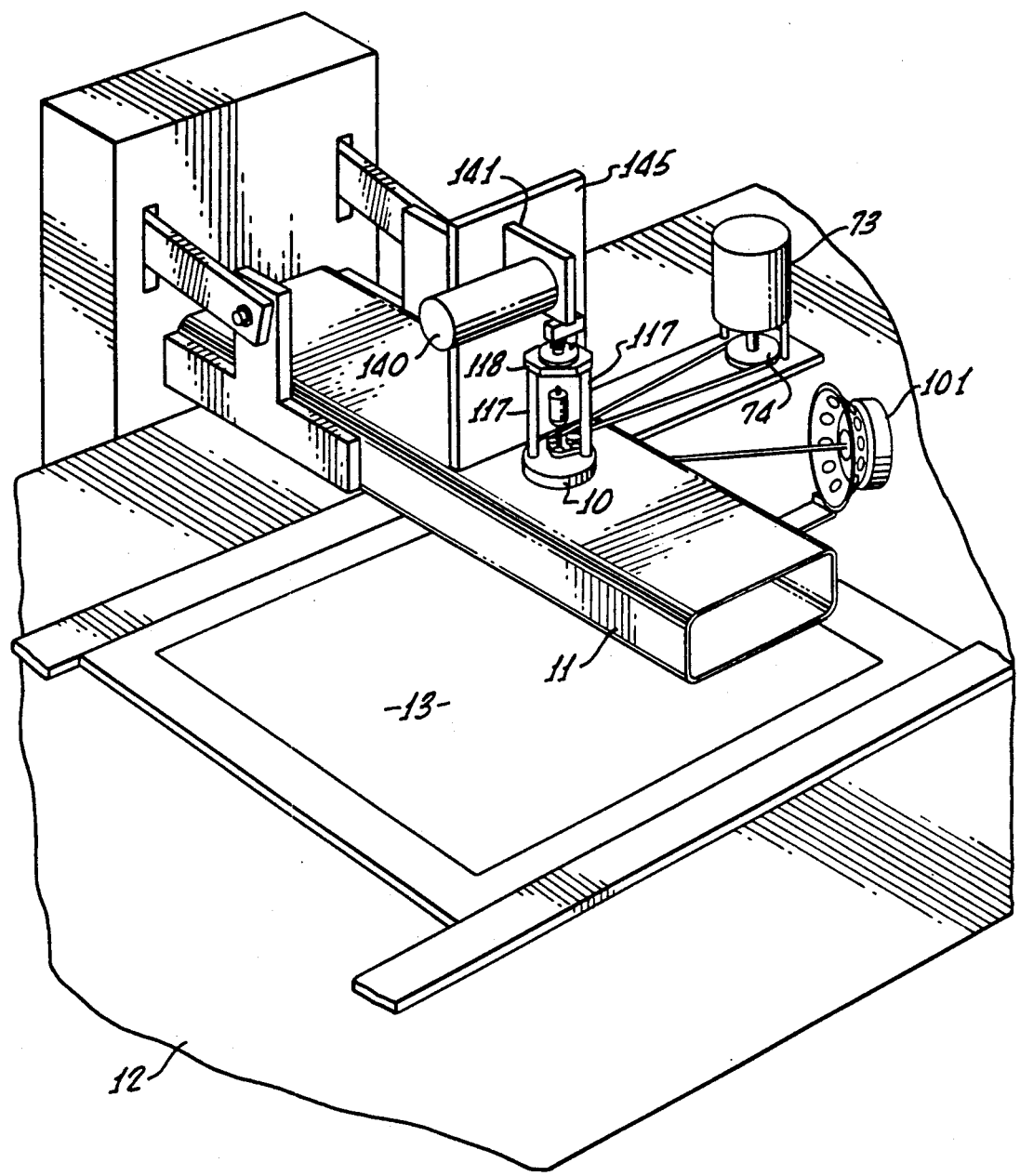
FIG. 1 is a perspective view of a machine incorporating the invention.

As shown in FIG. 1, the spindle of this invention includes a cylindrical housing 10 carried by a beam 11 above a table 12 upon which rests a workpiece 13 to be drilled or routed. In the embodiment illustrated, the table 12 can move horizontally in both the X and Y directions. However, it may be preferred to hold a workpiece 13 in a fixed position and move the spindle in the X and Y directions, which is particularly desirable because of the low weight and relatively small size of the spindle assembly.

Within the lower portion of the housing 10 are three circular rollers 14, 15 and 16, which may be metallic and are used to rotate and axially drive a rotary tool 17, such as a drill or router. The rollers 14, 15 and 16 are equally spaced apart angularly and collectively define an opening that receives the shank 18 of the rotary tool 17. The circumferential peripheries of all the rollers engage the shank 18 of the tool. When the rollers 14, 15 and 16 are rotated, they frictionally drive the shank 18 to rotate the tool. Because the rollers are of much larger diameter than the shank 18, the tool 17 is rotated much faster than the rollers. When three rollers are used, the tool may be rotated up to around six times as fast as the rotational speed of the rollers.

The tool 17 is moved axially by tilting the axes of the rollers 14, 15 and 16 as they rotate.

Drills and routers used in the printed circuit board industry and elsewhere all have drive shanks of a common diameter, irrespective of the size of the cutting end. Thus, the shank 18 of the drill 17 illustrated typically has a diameter of one-eighth inch, while the cutting end 19 is considerably smaller, such as a diameter of eight mils or less.

Figure 3:
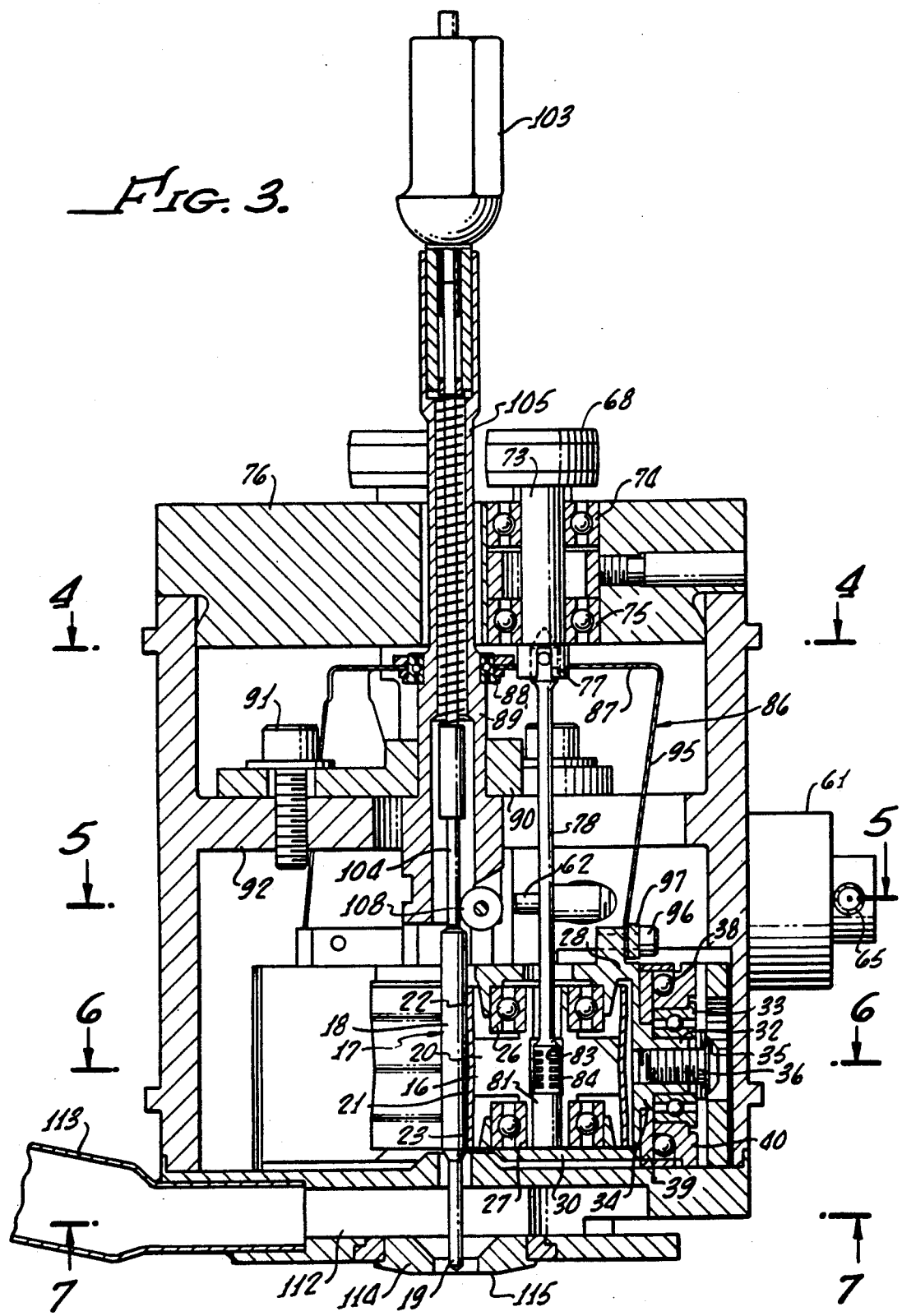
FIG. 3 is a longitudinal sectional view of the spindle arrangement.

The drive rollers 14, 15 and 16 are identical and are mounted in the same way. As shown in FIG. 3, the roller 16 includes a hub portion 20 around which is a sleeve 21. The latter element includes a band 22 at its upper end and a band 23 at its lower end, which are right cylinders and are the portions of the roller which engage the shank 18 of the drill 17. Therefore, the shank 18 is engaged in two spaced planes so that it is held securely and its longitudinal axis is parallel to the axes of the rollers 14, 15 and 16 when no axial movement is imparted to the tool. The effect is the same as if the shank 18 were engaged by two spaced sets of three rollers each.

The sleeve 21 is purposely made thin so that drill shank pressure against it can deform it to provide a soft tire to compensate for minute drill shank imperfections. For example, a force of five pounds exerted against the sleeve 21 will produce a deformation of 0.0001 inch.

Axially inwardly of bands 22 and 23 the sleeve 21 tapers to a smaller diameter near its center to avoid drill shank interference when the rollers are cocked to move the tool 17 axially.

The hub 20 includes axial extensions which are received within the inner races of two ball bearings 26 and 27. The outer race of the upper bearing 26 is carried by a support member 28 which extends down around most of the periphery of the roller 16. At its lower end the support member 28 is connected by screws 29 to a support plate 30 which extends beneath the roller 16, but does not engage it. Projections on the support plate 30 engage the outer race of the lower bearing 27. In this manner, the roller 16 is mounted for rotation about a vertical axis.

The support member 28 includes a lateral extension 32 that fits within the inner race of a ball bearing 33 which has its axis perpendicular to the axes of the bearings 26 and 27. At the inner edge of the bearing 33, the support member 28 provides a shoulder 34. The outer edge of the inner race of the bearing 33 is engaged by a Belleville washer 35 which is under the head of a screw 36 that fits within a tapped opening in the center of the extension 32 of the support member 28.

By being mounted in the ball bearing 33, the support member 28 can be rotated about an axis perpendicular to the axis of rotation of the roller 16. Such rotation will tilt the axis of rotation of the roller 16.

Figure 6:
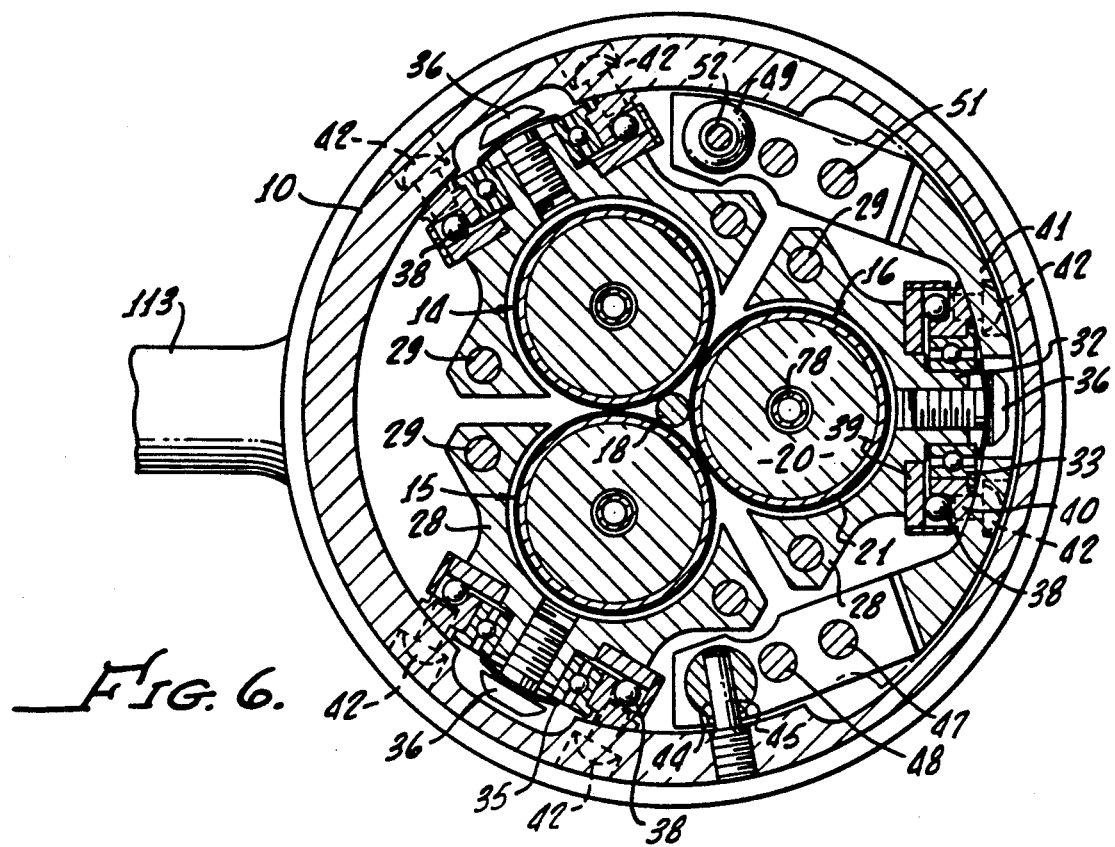
FIG. 6 is a transverse sectional view taken along line 6—6 of FIG. 3.
Figure 7:
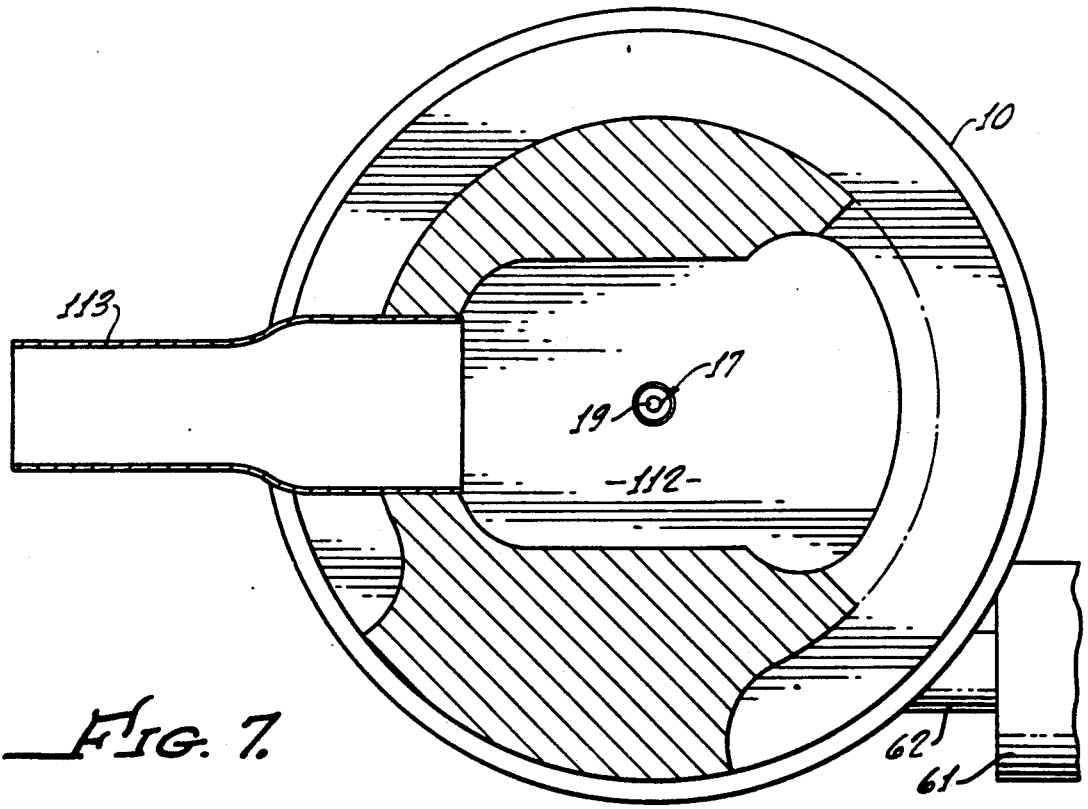
FIG. 7 is a transverse sectional view taken along line 7—7 of FIG. 3.

A thrust bearing 38 also is provided to absorb forces pushing radially outwardly on the support member 28. A flat ring 39, which has its axis concentric with the extension 32 of the support member 28, forms the inner race of the thrust bearing 38 adjacent the roller 16. The outer race of the bearing 38 is provided by a plate 40 which connects to a support. The outer surface of the plate 40 is curved in one plane and provided with openings that receive screws for attachment to the support. In the case of the roller 16, the support is a movable yoke 41 which has openings through which screws 42 extend to engage the tapped openings in the plate 40 (FIG. 6). The mounting of the yoke 41 is described below. The plates 40 for the other two rollers 14 and 15 are attached by screws to the housing 10. Thus, the positions of the rollers 14 and 15 are fixed, other than for the ability of their axes to tilt as described above.

The yoke 41 that carries the roller 16 can be pivoted so as to move the roller 16 toward or away from the two rollers 14 and 15. When pivoted toward the rollers 14 and 15, the roller 16 maintains the shank 18 of the drill 17 in engagement with the peripheries of all of the rollers so that it can be driven. When the roller 16 is moved away from the rollers 14 and 15, the drill 17 is released for removal from the rollers and replacement with a different drill.

To permit the roller 16 to be moved, one end of the yoke is mounted on a ball 44 which has a central aperture receiving a pin 45 which, exteriorly of the ball 44, is threaded into a tapped opening in the housing 10. The yoke 41 is provided with a recess that complementarily receives the ball at one end of the yoke. The bottom half of the ball 44 is confined by a similar recess in a member 46 held to the undersurface of the yoke 41 by a screw 47. A set screw 48 also is provided to allow adjustment of the clearance at the ball joint.

A ball 49 is held similarly at the opposite end of the yoke 41, confined at its lower portion by a member 50 held to the yoke by a screw 51.

The two supporting balls 44 and 49 are in a plane that bisects the roller 16 radially. This assures that the pressure of the bands 22 and 23 of the roller 16 against the drill shank 18 is nearly equal, irrespective of the skew angle of the roller or axial forces on the drill.

Figure 2:
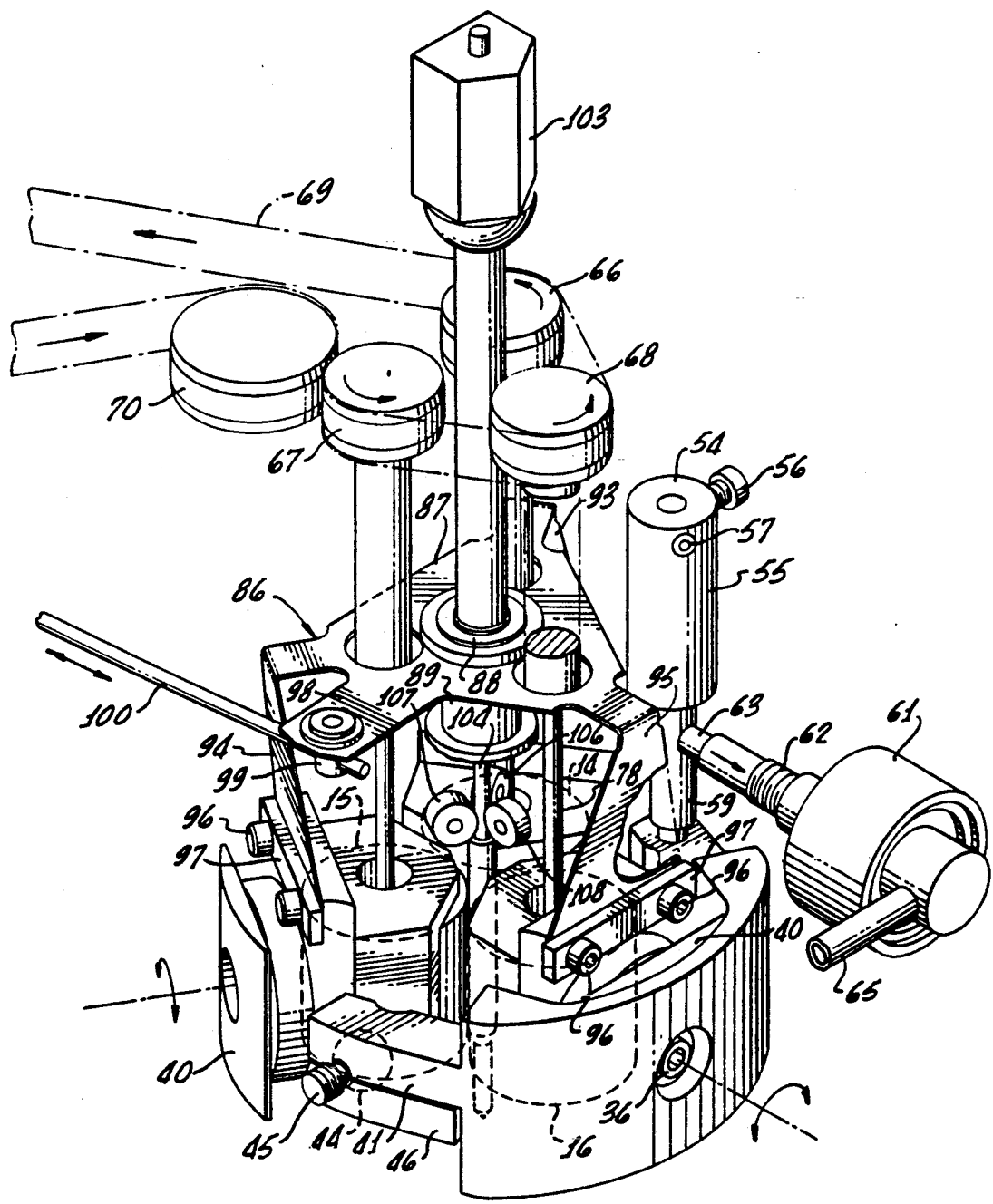
FIG. 2 is an enlarged fragmentary perspective view of portions of the machine within the housing.

Pivotal movement of the yoke 41 is accomplished by a rod 52 (FIGS. 4 and 5) which extends vertically of the housing and at its lower end has an extension that fits within the ball 49. The upper end 54 of the rod 52 (FIG. 2) is received within a member 55 which is attached to the housing 10 by a screw 56. A set screw 57 holds the upper end 54 in an opening in the member 55. Intermediate its upper and lower ends the rod 52 is of reduced diameter and possesses some flexibility. At its relatively large upper end 54, and at the similar lower end portion 58, the rod 52 is complementarily received within a sleeve 59.

An air cylinder 61 is provided with an extension 62 that threads into an opening in the housing 10. A rod 63 is received in the extension 62 and at its outer end engages the tube 59, to which it is perpendicular. The rod 63 extends from a movable piston 64. Air can be admitted into the cylinder 61 through a line 65 to exert a force on the piston 64 and bias the rod 63 toward the tube 59. The cylinder 61 also may be vented to atmosphere so that no force is exerted on the tube 59 by the rod 63.

In the free position, with the air cylinder 61 vented, the rod 52 holds the yoke 41 in its outer position such that the roller 16 is separated from the rollers 14 and 15 and the drill 17 is released. This movement is very slight from the position shown in FIG. 6. When air is introduced into the cylinder 61, the force is exerted on the tube 59 by the rod 63 at a location spaced from the confined upper end 54 of the rod 52. This causes the tube 59 to bend and with it the intermediate portion of the rod 52. This deflection of the rod 52 causes the yoke 41 to be pivoted to its inner position where it forces the shank 18 of the drill 17 into engagement with the rollers 14 and 15 so that the drill then can be engaged and driven by all three of the rollers. The rod 52 is resilient so that when the air is vented from the cylinder 61 the rod acts as a spring, returning to its initial position and releasing the roller 16 from the drill 17.

The rollers 14, 15 and 16 are driven by pulleys 66, 67 and 68, respectively, which are rotated by a belt 69 that also extends around an idler pulley 70. An electric motor 71, through a drive pulley 72, drives the belt 69.

The connection between the pulley 68 and the roller 16 is shown in FIG. 3. The other pulleys 66 and 67 are connected to the rollers 14 and 15 in an identical manner. Driven by the pulley 68 is a hollow shaft 73 which is mounted in two spaced ball bearings 74 and 75 carried by the upper end wall 76 of the housing 10. The lower end 77 of the shaft 73 is slotted axially. A rod 78 fits into the lower end 77 of the hollow shaft 73 where it is rotationally driven by a cross pin 79 that extends through the slot in the shaft 73. The lower end portion 81 of the rod 78 is hollow and of enlarged diameter, fitting complementarily in an opening in the lower portion of the hub 20 within the lower ball bearing 27. This is a press fit so that the rod 78 and hub 20 and, hence, the roller 16, are locked together and rotation of the rod will rotate the roller 16.

Above the end portion 81, the rod 78 is hollow, but of very slightly reduced diameter, and positioned within an enlarged opening 83 extending axially through the hub 20. At this location the rod 78 is provided with a number of pairs of transverse slots 84 at 90 degrees to each other through its wall to form a flexible coupling section. As a result, the portion of the rod 78 within the axial center of the roller 16 has some flexibility while retaining its structural integrity and ability to impart rotation to the roller.

The axes of the rollers 14, 15 and 16 may be tilted by the actuation of a member 86 of relatively thin-walled construction which includes a flat, horizontal plate 87. This portion of the member 86 is mounted for rotation in a horizontal plane by being secured to the outer race of a ball bearing 88, as seen in FIG. 3. The inner race of the bearing 88 circumscribes a tube 89 that extends vertically through the center of the housing 10 and is carried by a horizontal member 90 which is secured by screws 91 to a transverse wall 92 within the housing. The member 86 also includes three equally spaced vertical sections 93, 94 and 95 which depend from the outer edge of the flat plate 87 and connect to the members 28 through screws 96 and attaching strips 97. Clearance is provided in the openings through the vertical sections 93, 94 and 95 for the screws 96. This allows adjustment to cause the three rollers to track equally as they are tilted to move the drill axially.

An arm 98 projects outwardly from the horizontal plate 87 and is connected by a pivot pin 99 to one end of a rod 100. This rod extends through an opening in the housing 10 and at its other end is connected to the movable cone of a permanent magnet loudspeaker 101. Electrical signals are transmitted to the speaker 101, not to produce sound, but instead to impart movement to the rod 100. It is preferred to make use of a conventional permanent magnet speaker for this purpose because it becomes a very fast acting linear servo motor and will provide the rapid increments of movement necessary for appropriately tilting the axes of the rollers 14, 15 and 16.

When the rod 100 is moved axially, it produces rotational movement of the upper plate 87 of the member 86. This, through the depending portions 93, 94 and 95 of the member 86, imposes torque on the members 28, causing them to rotate about the axes of the bearings 33. As a result, the axis of each of the rollers 14, 15 and 16 is caused to tilt in a direction perpendicular to an imaginary line, interconnecting the axis of the tool 17 and the axis of the roller. This movement is permitted because of the flexibility of the rods 78, resulting from the existence of the slots 84 through the rods at their attachments to the rollers.

Figure 8:
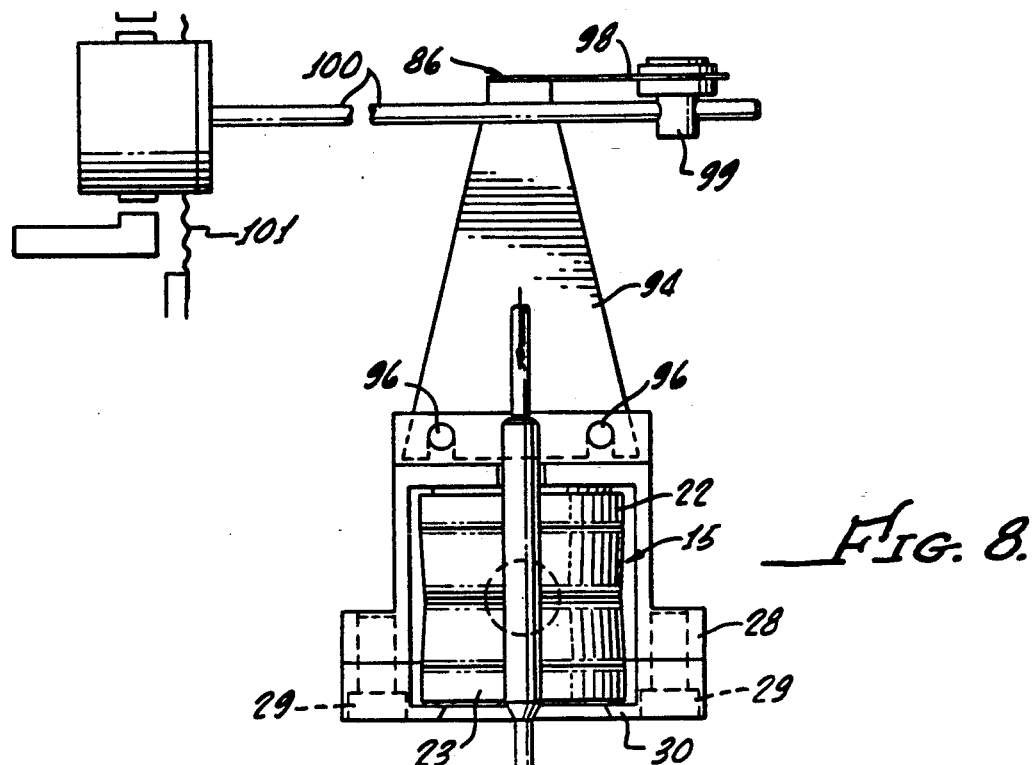
FIG. 8 is a fragmentary elevational view illustrating the engagement of a drive roller with a tool such that the tool is rotated but axially fixed.
Figure 9:
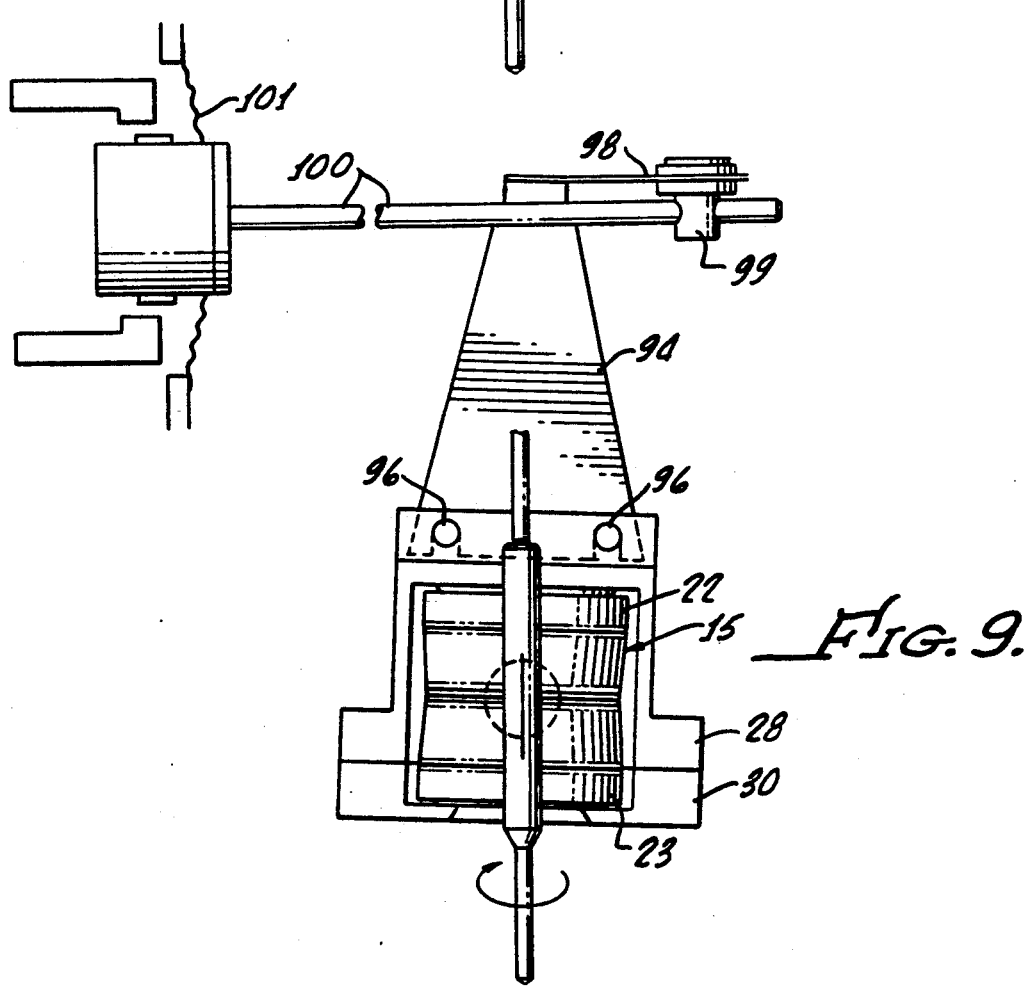
FIG. 9 is a fragmentary view similar to FIG. 8 but with the roller tilted to impart axial movement to the tool.

The tilting of the roller axes causes them to produce axial movement in the drill 17. This effect is illustrated in FIGS. 8 and 9, where the amount of tilting of the roller axis is greatly exaggerated. In reality, very rapid axial movement of the drill 17 is accomplished by very slight tilting of the roller axes by virtue of the extremely high speeds at which the drill is rotated. Tilting in one direction will cause the drill to be driven downwardly and tilting in the opposite direction will move it upwardly. It is necessary to make slight corrective tilts of the drive rollers even at times when the tool 17 is to remain motionless axially. This is because it is not possible to achieve absolutely perfect alignment and parallelism between the roller axes and the axis of the driven tool. Any lack of such alignment will result in axial movement so that the driven tool would not remain axially fixed were it not for constant corrections of the angles of the rollers. For a machine that will drive the tool 17 at around 330,000 rpm, it is preferred to correct the roller tilt angle every one-tenth revolution.

The vertical position of the tool 17 is detected at all times so that appropriate motion may be imparted to the member 86 for controlling the tilt of the drive rollers 14, 15 and 16. To this end, the conventional position pickoff 103 is mounted above the housing, with a follower rod 104 extending downwardly through the tube 90. The lower end of the rod 104 bears against the upper end of the shank 18 of the tool 17, held in this position by a compression spring 105 within the tube 90. The rod 104, which may be segmented, does not rotate with the tool. Three rollers 106, 107 and 108, which have their axes in a horizontal plane, bear against the periphery of the lower end portion of the rod 104, keeping it aligned with the tool 17. A tension spring 109 extends around the lower portion of the tube 90 and at its ends engages the pin 110 that mounts the roller 108. This forces the roller 108 against the lower end of the rod 104 assuring that there is engagement of all three rollers 106, 107 and 108 with the rod.

The lower end portion of the housing 10 defines a chamber 112 which circumscribes the cutting end 19 of the tool 17. A vacuum line 113 connects to the chamber 112 and draws away the cuttings generated by the action of the tool 17. A collar 114 at the lower central portion of the chamber 112 has a bottom flat surface 115 which engages the workpiece and acts as a pressure foot during operation of the tool 17.

Figure 10:
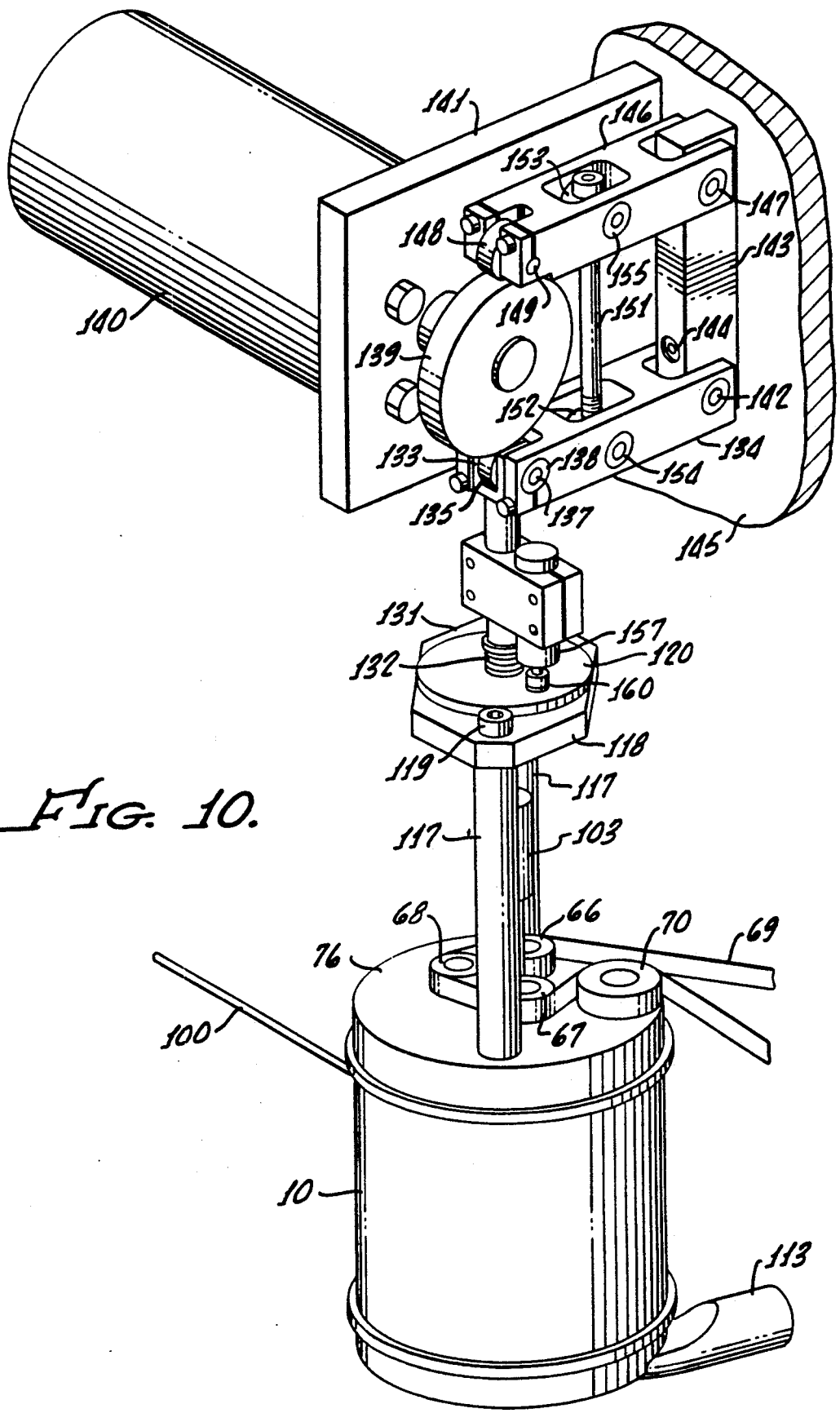
FIG. 10 is a fragmentary perspective view of the arrangement for causing vertical movement of the spindle housing.
Figure 11:
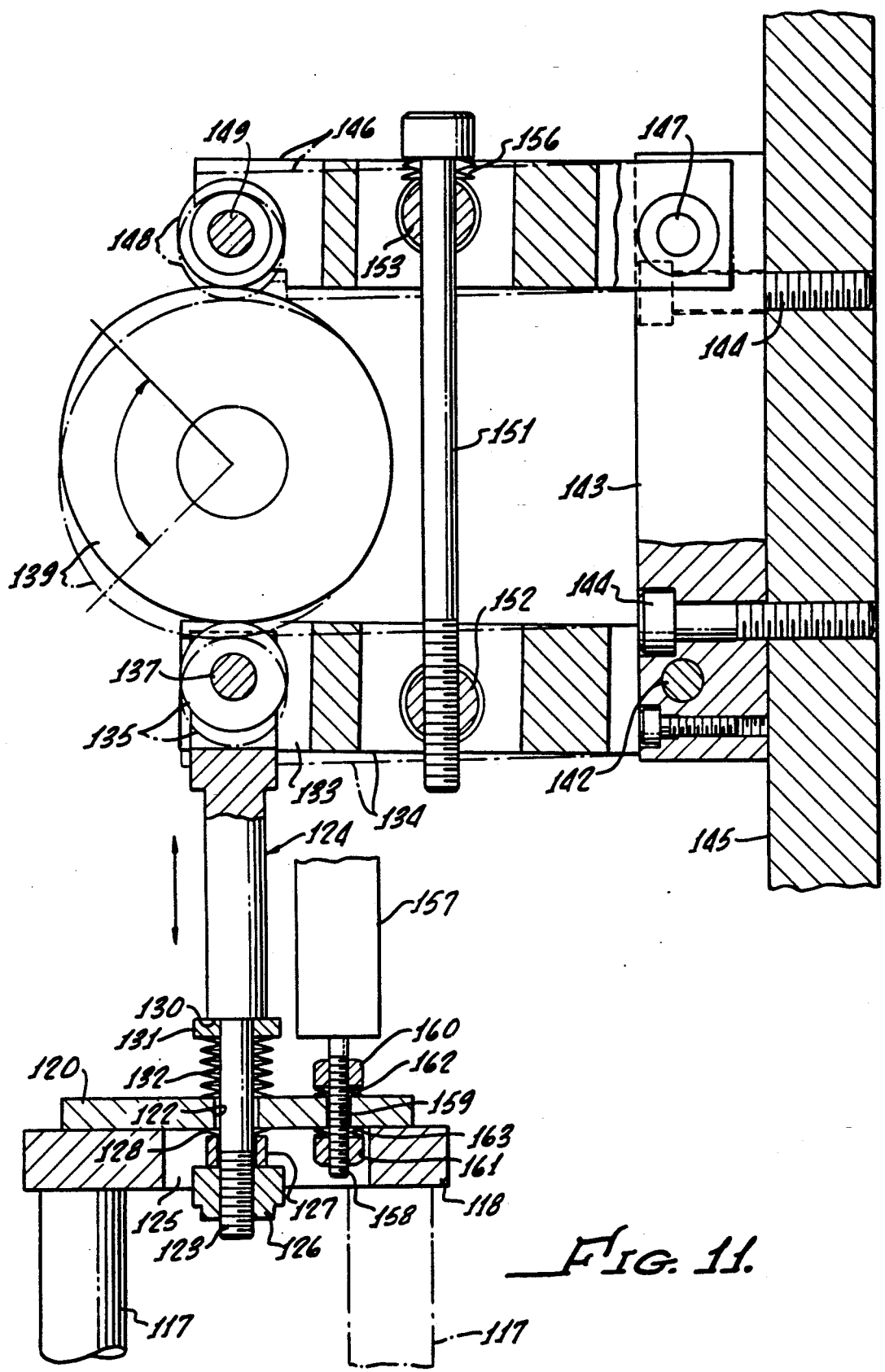
FIG. 11 is an enlarged sectional view taken along line 11—11 of FIG. 10.
Figure 13:
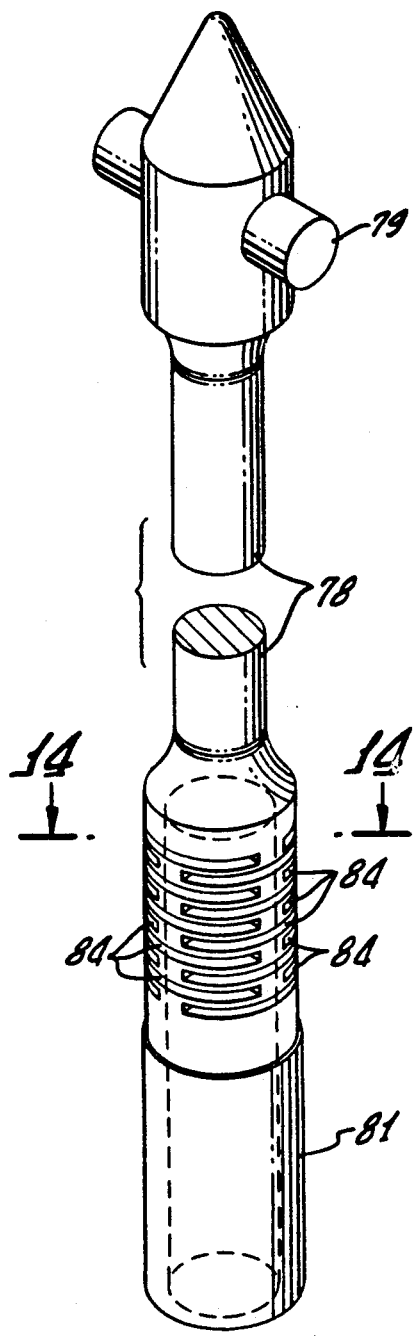
FIG. 13 is an enlarged fragmentary perspective view of the flexible end portion of the roller drive shaft.
Figure 14:
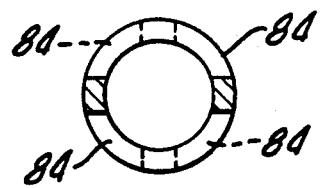
FIG. 14 is a transverse sectional view taken along line 14—14 of FIG. 13.
Figure 12:
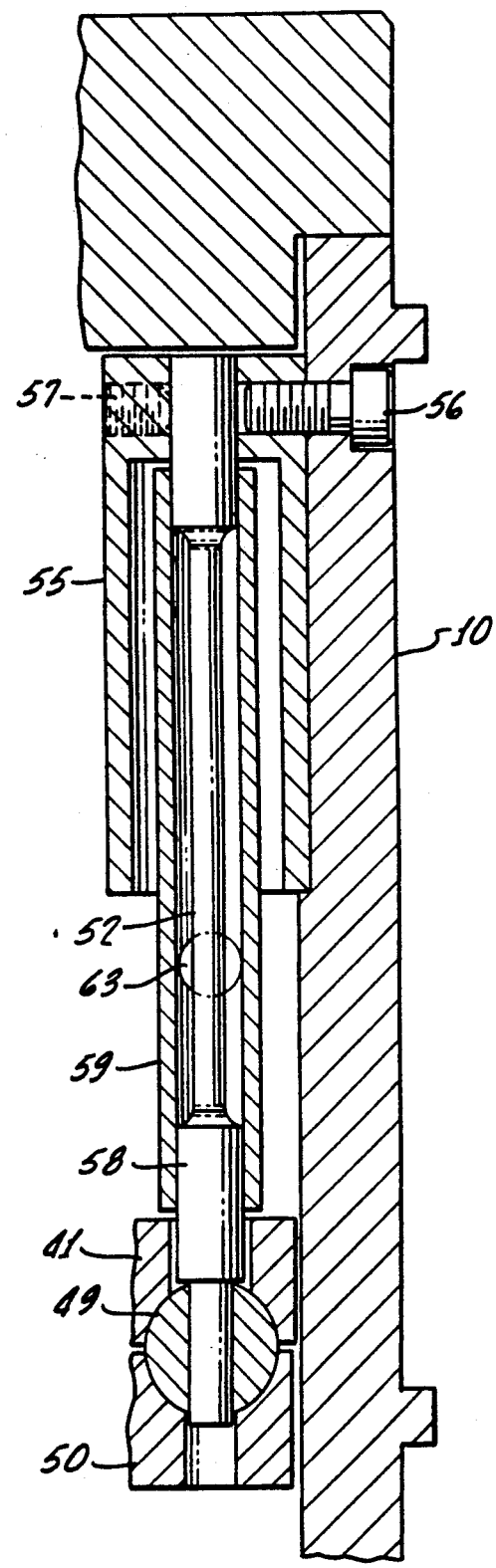
FIG. 12 is an enlarged sectional view taken along line 12—12 of FIG. 5.

The arrangement for moving the housing 10 so that the bottom surface 115 of the collar 114 can serve as a pressure foot is shown in FIGS. 10 and 11. The upper end wall 76 of the housing 10 is connected by two vertical posts 117 to a horizontal plate 118 by means of screws 119. A smaller flat horizontal plate 120 is secured by screws 121 to the upper surface of the plate 118. An opening 122 in the center of the plate 120 receives the lower end portion 123 of a vertical rod 124, this part of the rod also extending through a relatively large opening 125 in the plate 118. The bottom end of the portion 123 of the rod 124 is threaded and received within a nut 126. A collar 127 also extends around the lower portion 123 of the rod 124, as well as a Belleville washer 128 adjacent the collar that engages the undersurface of the plate 120.

Above the plate 120 the rod 124 is of increased diameter, providing a radial shoulder 130 engaged by a washer 131 that extends around the lower portion 123. A compression spring 132 extends between the washer 131 and the upper surface of the plate 120.

The upper end of the rod 124 defines a yoke 133 which is received within the slotted outer end of a generally horizontal link 134. A roller 135, which acts as a cam follower, is received within the yoke 133. An axle 137 rotationally mounts the roller 135, extending through openings in the yoke 133 and into bearings 138 in the outer end of the link 134.

Engaging the roller 135 is a cam 139 rotatable by a motor 140 secured to a support plate 141.

The inner end of the link 134 is connected by a pivot pin 142 to a vertical link 143 that is connected by screws 144 to a vertical support plate 145. The inner end of the link 134 is slotted to receive the vertical link 143.

A second horizontal link 146 is generally similar to the link 134, being of the same length. The inner end of the link 146 is slotted and, through a pivot pin 147, connects to the upper portion of the vertical link 143. The opposite end of the link 146 is slotted and receives a roller 148 which acts as a second cam follower. The roller 148 is rotatably carried by a transverse pin 149 that extends through the outer end of the link 146.

The rollers 135 and 148 are maintained in engagement with the periphery of the cam 139 by means of a vertical bolt 151 which interconnects the links 134 and 146 intermediate their ends. The bolt 151 is pivotally connected to the links 134 and 146 by means of transverse members 152 and 153, mounted in bearings 154 and 155 respectively. By tightening the bolt 151, the cam follower rollers 135 and 148 can be caused to firmly engage the surface of the cam 139 yet adjusted so that free movement of the cam is permitted. Belleville washer 156 beneath the head of the bolt facilitates the adjustment.

The cam 139 is arranged so that irrespective of its rotational position the spacing between its cam follower centers remains the same.

Vertical movement of the housing 10 is accomplished by oscillation of the cam 139. When the cam 139 is rotated by its motor 140, the lobe of the cam, by bearing on the roller 135, forces the rod 124 downwardly. This, in turn, acting through the washer 131 and the compression spring 132, reacts through the plates 120 and 118 and the connection at the rods 117 to move the housing 10 downwardly until the bottom surface 115 of the collar 114 engages the workpiece 13. The amount of downward force is determined by the compression imparted to the spring 132 through the movement of the rod 124. This force holds the workpiece 13 firmly against the table 12 during the operation of the tool 17.

Raising of the housing 10 to permit movement to the next station for operation on the workpiece 13 is accomplished by reverse rotation of the cam 139 a computer controlled amount. The lobe of the cam 139 then reacts against the follower roller 148, pivoting the link 146 upwardly. By virtue of the connection by the bolt 151, the link 134 also is pivoted upwardly. This, through the connection to the yoke 133 of the rod 124, lifts the rod 124 upwardly in the vertical direction. The Belleville washer 128 then is brought into engagement with the undersurface of the plate 120 and through the collar 127 and the nut 126 lifts the plate 120 and with it the housing 10.

The control of the motor 140 moves the housing up or down at selected times. Housing position, up or down, must be known before movement to the next station or drilling may be commenced. Housing position is signalled by a position sensor that includes a differential transformer 157 which is held in a fixed position vertically. A core 158 projects downwardly from the differential transformer 157 through an opening 159 in the plate 120. A nut 160 is threaded onto the projecting end of the core 158 above the plate 120 and another nut 161 is threaded onto the core 158 below the plate 120. Belleville washers 162 are positioned between the nut 160 and the plate 120 and similar Belleville washers 163 are between the nut 161 and the plate 120. When the plate 120 is moved downwardly by the rotation of the cam 139 imparted by the motor 140, the core 158 also is moved downwardly. This produces an output signal from the differential transformer 157 which is used to signal housing position. When the core 158 returns to the upper position, the differential transformer also indicates the upper position of the housing.

Figure 15:
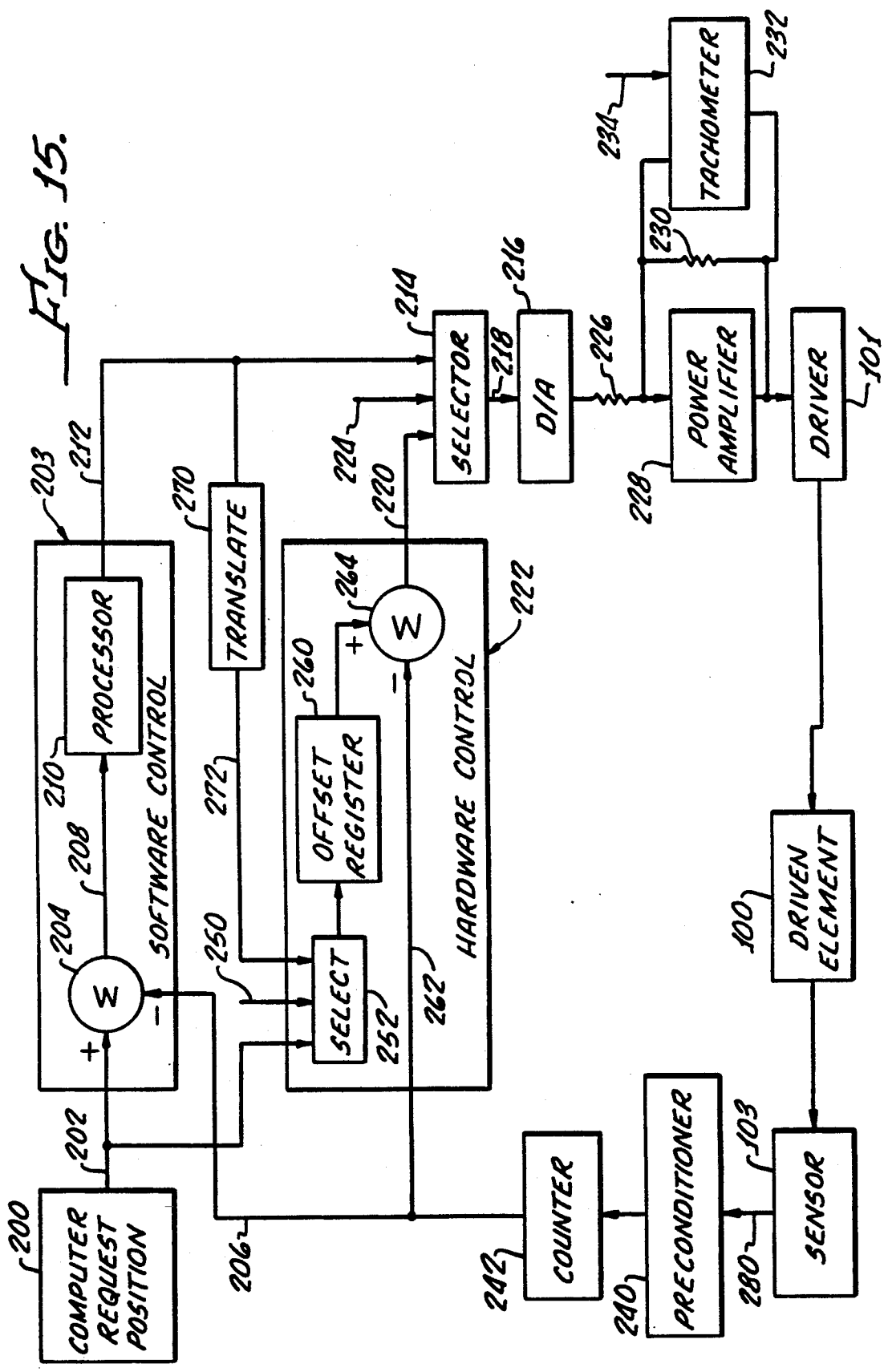
FIG. 15 is a simplified block diagram of an exemplary control system for tilting the roller axes.

FIG. 15 illustrates a simplified block diagram of a system for control of roller tilt. Control of the entire drilling system is provided by either a general purpose or specifically designed computer. Functional parts of the computer employed in the roller tilt control are illustrated in FIG. 15. A requested or commanded position for the drill bit is computed from a drill file by computer, as indicated by functional box 200, and provided on a requested position line 202 to one input of an error or summing network 204, which has a second input that receives feedback signals, on a line 206, representing actual position of the drill bit. The requested position is compared with actual position to create an error or difference signal on a line 208 which is fed to a signal processor 210. Processor 210 may be one of a number of different types of error signal processors, frequently known as "minimum time response ripple free controllers", and processes the error signal on line 208 for the purpose of reaching a stable commanded position in minimum time. The processor calculates a software control signal output, provided on a processor output line 212, in accordance with position, velocity and acceleration, as represented by the error signal on line 208, and feeds the control signal through a selector 214 to a digital to analog converter 216. Processor 210 may operate in accordance with the following equations:

$$e1\ new = (\text{total calc. distance} - \text{position new})\ CF$$

$$e2\ new = ((2.0 * e1\ new) - e1\ old) - (0.5 * e2\ old)$$

where e1 new is output on line 208 of the first summing network 204, the total calculated distance is the commanded position, position new is the actual position as signalled by the sensor, CF is a correction factor, e2 new is the control signal produced on line 212 of the output of processor 210, e1 old is the error signal present in the previous iteration of this loop, and e2 old is the control signal output in the previous iteration. The two equations comprise a portion of the software code that loops continuously until the drill reaches the final position, at which time the hardware path locks onto the value in the offset register. Correction factor CF is defined by the equation $$CF = e^{-\frac{Dt}{T}}$$

where D is an empirically determined percentage difference of the ratio of the predetermined time required for the computer to make the calculations of the error signal to the actual time required for such calculations, t is continuous time and T is the period of the process loop.

Selector 214 is functionally nothing more than a switch which provides on a selector output line 218 either the selector input provided on line 212 or an alternative selector input provided on a line 220 from a hardware control circuit 222, to be described below. Under control of a signal from the computer on a line 224, the selector feeds the control signal on line 218 to digital to analog converter 216, which in turn sends the signal via a resistor 226 to a power amplifier 228, from the output of which is provided the signal fed to control the driver or motor of this closed loop system. In the present system the driver is speaker 101.

For control of response time of the signal fed through the power amplifier, a closed loop in the form of a tachometer feedback circuit is provided in which a resistor 230 is connected across the input and output of the power amplifier, with a tachometer 232, which is effectively a set of filters, connected across resistor 230.

Under control of a signal on a line 234 from the computer, the tachometer is activated or deactivated so as to effectively provide two different levels of gain for the power amplifier 228. During controlled tilting of the roller axes the tachometer is effectively deactivated so that the power amplifier has a relatively low gain and will react to relatively high levels of the control signal. When tilt of the roller axes is to be held effectively at zero, so that no vertical motion of the drill bit is commanded, the tachometer is activated to effectively increase the gain of amplifier 228 so that it will respond more rapidly to the smaller control signals which are present when the bit is effectively held in a fixed position. As previously described, driver (speaker 101) drives a driven element which is rod 100. Axial motion of the rod controls tilt of the rollers that axially drive the tool. As the tool moves up or down its position is sensed by the rod 104 (FIG. 3) which is part of a conventional position measuring device or sensor 103, such as a Sony MAGNASCALE Model MD20A. Sensor 103 provides two trains of directional output pulses, the first train indicating motion in one direction, such as up for example, and the second indicating motion in the opposite direction, such as down. The output pulse trains are fed to a preconditioner 240, which will be described more particularly below, and thence to a bi-directional up/down counter 242 that provides the tool position feedback via line 206 to error circuit 204.

The described system, particularly because it employs the processor 210, requires significant amounts of computer time and effectively keeps the process computer occupied even when the driven element is standing still (e.g. no commanded axial motion of the drill bit). In fact, when the bit is nominally standing still it may still be moving, by very small amounts, in an oscillatory fashion back and forth, above and below its commanded position. Thus the described closed loop position control is continuously operating, not only when the bit is being moved axially to a selected position, but also when it is in a nominally stationary position.

In order to free the computer from its required operations while the tool is in a nominally fixed position, the signal fed to digital analog converter 216 via selector 214 is switched from the output of the processor 210 to the output of the hardware control circuit generally shown in box 222. Effectively, the hardware control circuit 222 is used instead of and as a bypass of the software control illustrated in box 203. In some situations the output of the processor may be used in conjunction with the hardware control, as will be explained below. Thus the closed loop control has two separate feedback paths or control modes in the one closed loop. The two paths are the software control path 203 and the hardware control path 222. In commanded motion of the drill bit to a selected position, the servo loop employs the software path 203 and the hardware path 222 is disconnected from the loop. When the bit reaches the selected position, the error signal is effectively zero or very small. This is used by the computer to switch operation to the hardware path, sending signals to control the selector and taking the software path out of the control loop.

The software or hardware mode of the closed loop control of the driven member is chosen by a select signal fed from the computer on a line 250 to a selector or switch 252 that receives the requested tool position on line 202 and also receives the control signal output from processor 210 on lines 212 through 272. In hardware control mode, selector 252 is operated so that only the computer requested position on line 202 is fed through the selector to an offset register 260, which stores the number identifying or defining the desired tool position. Under hardware control the number stored in offset register 260 is compared with the tool bit position as indicated by the output of counter 242 on a line 262. A hardware control mode summing or error network 264 receives the output of offset register 260 and the position feedback signal from counter 242 on a line 262 and provides a hardware control signal on the line 220. The latter signal, as previously discussed, is fed under control of selector 214 to the digital to analog convertor 216 so that when hardware control alone is employed the software control loop, including all elements of box 203, are disabled and are effectively out of the loop. Thus the computer, and particularly the processor 210, are free to perform other functions, such as communication and other calculations, thereby greatly increasing control speed. Tachometer 232, which as previously described is employed when the tool is at or close to its commanded position, is turned on when the hardware mode control is turned on, and thereby increases stability of the "standing still" position of the tool. For control of motion of the bit, the software control path 203 is employed and the hardware control path 222 is effectively out of the loop.

In some modes, such as for very fine control of small increments of motion, as for example during the actual drilling as the drill bit moves below the surface of the work, it may be desirable to combine hardware control with the software control. To this end selector 252 is controlled to feed to offset register 260 the output of the processor 210 of the software control instead of the output of the computer requested position signal on line 202. In such a combined mode the processed control signal on line 212 is fed through a translating circuit 270, which merely offsets the signal on line 212 and feeds the offset control signal via a line 272 and selector 252 to the offset register 260. The software control signal depends upon the predetermined output of the processor 210 when the tool is at the selected position. Thus, in this combined software and hardware mode, the offset register stores the output of the processor 210, which has been altered by the translator 270. When in combined mode, selector switch 252 feeds only the modified software control signal to register 260 and selector switch 214 feeds only the output of hardware error circuit 264 to the digital to analog connector 214.

Preconditioner 240 of FIG. 15 enables the directional up/down counter 242 to operate independently of any external clock. Further, it provides useful operation when the tool bit is effectively standing still, but actually oscillating by very small amounts back and forth across its home position. Most bi-directional counters require an external clock which must be carefully chosen in the light of the equipment and its operating characteristics so as to ensure that clock speed is high enough for operation of the system and yet to avoid providing clock speeds that are unnecessarily high and, accordingly, unnecessarily expensive. When the controlled device is nominally at its home position, the sensor output effectively switches between alternate up and down signals that are so close together as to be indistinguishable in time by the counter. Under such circumstances prior art counters may simply cease operating.

This problem may be explained somewhat differently as follows. A requirement of the system is to count the sensor output pulses when sensor rod 104 is almost standing still. During normal upward or downward motion of the sensor rod one set of pulses occurs during motion in one direction, and the other set of pulses occurs during motion in the other direction. When the sensor rod is almost standing still the signal is changing from one direction to another at very closely spaced times. Conventional counters having up and down inputs cannot operate if both up and down signals occur at effectively the same time.

Figure 16:
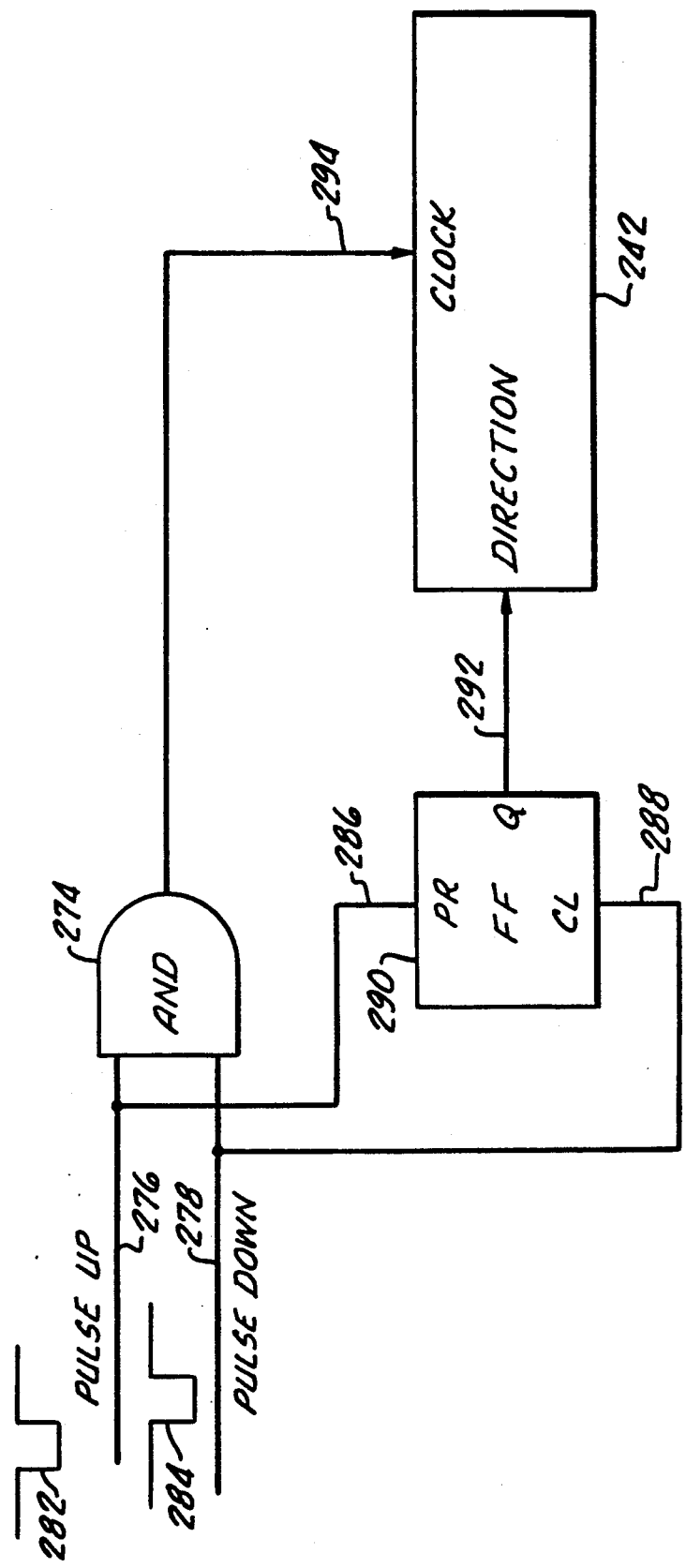
FIG. 16 illustrates circuitry of a preconditioning circuit of the control system.

The preconditioning circuit illustrated in FIG. 16 avoids these problems by providing an AND GATE 274 that receives up pulses on a first input line 276 and down pulses on a second input line 278. The lines 276 and 278 are collectively indicated by line 280 in FIG. 15 as the output of the sensor 103. In an exemplary embodiment the up and down pulses 282 and 284 are provided by lines that are normally at 5 volts, for example, and are dropped to 0 volts upon the occurrence of an output pulse from the sensor circuitry. The two pulse trains, on lines 276 and 278, are fed respectively on a line 286 to a preset input PR and on a line 288 to a clear input CL of a flip-flop 290 that provides a high signal Q on an output line 292 when preset and a low signal when cleared. The signal on line 292 is fed to the direction controlling input of the bi-directional counter 242, which responds to a high signal by counting up and responds to a low signal by counting down. The output of the AND GATE 274 is fed to the clock input 294 of the counter 242, which responds to a transition from low to high and which accordingly counts output pulses provided by the AND GATE.

The described circuit produces clock and direction pulses on the same pulse. The one of the low signals on either line 276 or 278 that is most recent in time determines the state of flip-flop 290. The rising edge of the same signal yields the low to high transition that will clock the counter, which has been set in the direction of the last occurring one of pulses 282 and 284. If the two pulses occur near the same time, it is clear that the chronologically most recent of the two of these represents motion in the last direction, and thus the direction in which the counter should be controlled. In other words, if the last pulse is an "up" pulse, the rod was last moving upwardly. Physically, of course, it is not possible for the pulses to occur exactly at the same time, but they can be so close as to be nearly indistinguishable. With correct selection of device characteristics, the described circuit can detect signals that are as little as 3 nanoseconds apart to allow for correct tracking of changing signals faster than 100 megahertz.

Consider the pair of pulses 282 and 284 and assume that pulse 284 is the pulse that is earlier in time. After pulse 284 has occurred the input on line 278 to the AND GATE 274 is high. During occurrence of the second of the two pulses, namely pulse 282, the input to AND GATE on line 276 temporarily goes low so that the output of AND GATE 274 is also low. Now upon the rising trailing edge of the second of the two pulses, namely pulse 282, the second input of the AND GATE goes high, whereby the output of the AND GATE changes from low to high, which is the signal that triggers the counter clock input terminal. Thus the bi-directional counter 242 is always triggered on the rising edge of the last of the two pulses. Whether the pulses provided from the sensor are at a high or low repetition rate the counter is clocked at the rate of such pulses and thus is clocked independently of any external clock.

No matter how close the pulses are, and assuming for example that they are so close that the circuit apparently sees some overlapping of the two pulses, the two inputs from the two lines 276 and 278 to preset and clear inputs of the flip-flop are both low (if both pulses appear to occur simultaneously) and the flip-flop is in an unknown state. When the earlier of the two pulses terminates, the later of the two pulses sets direction. When the later of the two pulses terminates, its level will preset (assuming that pulse 282 is the later) the flip-flop, and thus provide a high on flip-flop output line 292 which sets the counter into its up counting direction. Alternatively, should pulse 284 be the later of the two, its level transmits a low signal to the clear input of the flip-flop, which provides a low on flip-flop output 292 to set the counter in its down counting direction. In either case, when the later signal goes high it causes a low to high transition on line 274, causing the counter 242 to clock on from line 294.

The foregoing detailed description is to be clearly understood as given by way of illustration and example only, the spirit and scope of this invention being limited solely by the appended claims.

What is claimed is:

1. The method of imparting movement to a rotary tool having a cylindrical shank comprising the steps of arranging a plurality of circular rollers in adjacency,
    positioning the cylindrical shank of a rotary tool so that said shank is engaged by the circumferential peripheries of all of said rollers,
    rotating said rollers so that said circumferential peripheries frictionally drive said shank and impart rotational movement thereto, and
    tilting said rollers to impart axial movement to said rotary tool.

2. The method as recited in claim in which said rollers are so tilted in one direction for imparting axial movement to said tool in one direction and are so tilted in the opposite direction for imparting axial movement to said tool in the opposite direction.

3. The method as recited in claim 1 in which said rollers are formed to have equal diameters.

4. The method as recited in claim 1 in which there are three of said rollers.

5. The method as recited in claim in which said rollers are arranged so that said circumferential peripheries thereof engage said shank at axially spaced locations along said shank.

6. The method as recited in claim 1 in which said rollers are arranged to all so engage said shank in the same plane.

7. The method as recited in claim in which said rollers are arranged with their axes parallel.

8. The method as recited in claim in which said circumferential peripheries of said rollers are formed to provide two spaced portions of equal diameter for so engaging said shank, and are formed to provide a portion of lesser diameter intermediate said two spaced portions for providing clearance and avoiding contact with said shank intermediate said spaced portion upon so tilting said rollers.

9. The method as recited in claim 1 in which for so rotating said rollers a shaft is connected to and projects from each of said rollers, a pulley is provided on each of said shafts, and a belt is extended around said pulleys in a driving relationship whereby movement of said belt causes rotation of said pulleys and with them said shafts and said rollers.

10. The method as recited in claim 1 in which for so engaging the shank of a rotary tool, two of said rollers are maintained in a fixed spaced relationship relative to each other, the third of said rollers is moved away from said two rollers, said shank of said tool is positioned adjacent the circumferential peripheries of said two rollers and then the third of said rollers is moved toward the other two of said rollers so as to engage said shank by the circumferential periphery of said third roller and force said shank into engagement with the circumferential peripheries of said two rollers.

11. The method as recited in claim 10 in which for so moving said third roller toward said two rollers a pneumatic force is applied to said third roller and is maintained on said third roller for holding the circumferential peripheries of all of said rollers in engagement with said shank of said rotary tool.

12. The method as recited in claim 1 in which each of said rollers is so tilted in a direction perpendicular to a line extending between said axis of said shank and the axis of the roller.

13. The method of imparting movement to a rotary tool having a cylindrical shank comprising the steps of arranging a plurality of circular rollers in adjacency so that their axes are parallel, positioning the cylindrical shank of a rotary tool so that said shank is engaged by the circumferential peripheries of all of said rollers and held thereby so that its longitudinal axis is parallel to the axes of said rollers,
    rotating said rollers so that said circumferential peripheries frictionally drive said shank and impart rotational movement thereto, and tilting said rollers simultaneously and in equal amounts to impart axial movement to said rotary tool.

14. In combination with a rotary tool having a cylindrical shank,
    a plurality of rollers positioned so that the circumferential surfaces thereof collectively define an opening,
    said shank of said rotary tool being received in said opening and engaged by said circumferential peripheries of said rollers,
    means for rotating said rollers about axes parallel to the axis of said shank of said rotary tool,
    whereby said rollers frictionally rotate said rotary tool, and means for tilting said rollers relative to the axis of said shank for causing said rollers to impart axial movement to said rotary tool.

15. A device as recited in claim 14 in which there are three of said rollers, all of the same diameter.

16. A device as recited in claim 15, including means for moving one of said rollers laterally away from the other two of said rollers so as to enlarge said opening for permitting removal and insertion of said rotary tool in said opening, and means for moving said one roller laterally toward said other two rollers for so engaging said shank for so rotating said rotary tool.

17. A device as recited in claim 14, including bearing means for rotatably mounting each of said rollers for rotation about its axis, a support for each of said bearing means, and an additional bearing means for each of said supports for rotating each of said supports about an axis perpendicular to the axis of said first bearing means of each of said rollers, said axes of said additional bearing means intersecting at a location coincident with the axis of said rotary tool when said peripheries of said wheels so engage said rotary tool.

18. A device as recited in claim 14 in which for so rotating said rollers a shaft projects from each of said rollers, and including means for rotating said shafts and thereby said rollers, each of said shafts being flexible so that said shafts become bent when said rollers are so tilted.

19. A device as recited in claim 14 in which for so rotating said rollers a shaft projects from each of said rollers, a fixed bearing is provided for mounting each of said shafts at a location remote from the roller associated with the same, means are provided for rotating said shafts within said bearings, and said rods are flexible so as to permit said tilting of said rollers.

20. A device as recited in claim 19 in which each of said shafts includes a hollow portion and is provided with a plurality of slots through said hollow portion for thereby imparting flexibility to said shaft at said hollow portion.

21. A device as recited in claim 14 including, in addition, means for sensing the axial position of said rotary tool, and means for controlling the amount of tilting of said rollers to position said rotary tool in a desired axial location.

22. A device as recited in claim 14 in which said means for tilting said axes of said rollers is arranged to tilt each roller axis in a direction perpendicular to a line interconnecting said axis of said shank and the axis of the roller.

23. A device as recited in claim 14 in which each of said rollers has a peripheral surface so engaging said shank at a plurality of locations spaced from each other axially along said shank.

24. A device as recited in claim 23 in which each of said rollers has two of such peripheral surfaces.

25. A device as recited in claim 14 including means surrounding said rotary tool for defining a pressure foot, and including means for reciprocating said pressure foot so that said pressure foot can engage a workpiece at the time said rotary tool engages the workpiece.

26. In combination with a rotary tool having a cylindrical shank,
a plurality of rollers having circular peripheries, means for mounting said rollers so that their axes are parallel,
means for simultaneously rotating said rollers,
said means for mounting said rollers being arranged such that said peripheries of said rollers engage said shank and hold the same with its longitudinal axis in a predetermined location, whereby when said rollers are rotated said peripheries of said rollers rotate said shank, and
means for tilting said axes of said rollers relative to said axis of said shank for causing axial movement of said rotary tool.

27. A device as recited in claim 26 in which said rollers are arranged such that said peripheries thereof engage said shank at axially spaced locations along the same.

28. A closed loop control system for positioning a driven element comprising:
driver means for driving the driven element,
sensor means coupled with the driven element for generating a feedback signal indicative of motion of the driven element,
command input means for generating a commanded position of the driven element, and
first and second feedback path means for providing first and second independent feedback paths from said sensor and command means to said driver means, said first feedback path means comprising:
a first summing network having command and feedback inputs respectively responsive to said commanded position and said feedback signal and providing a first error signal, and
processor means for processing said first error signal and having a first control signal output,
said second feedback path means comprising:
a second summing network having command and feedback inputs respectively responsive to said commanded position and said feedback signals, said second summing network providing a second control signal output, and
means for selectively feeding said first or second control signal outputs to said driver means.

29. The system of claim 28 including a register adapted to receive said commanded position from said command input means and to provide an input to said command input of said second summing network.

30. The system of claim 29 including means for selectively feeding either a function of said first control signal or said commanded position to said register.

31. The system of claim 28 wherein said processor means includes means for processing the first error signal to cause the driven element to reach a stable commanded position in minimum time.

32. The system of claim 30 including translator means interconnected between the output of said processor means and the input of said register for changing the magnitude of said first control signal.

33. A preconditioning circuit for use with a motion sensing device that provides first direction and second direction pulse trains respectively representing sensed motion in two mutually opposite directions, and an up/down bi-directional counter having a clock terminal and a counting direction control terminal, said preconditioning circuit comprising:
means responsive to both of said pulse trains for providing a clock input to said counter clock terminal in response to each pulse of each of said pulse trains, and
means responsive to both of said pulse trains for providing an input to said direction control input of said counter to set the counting direction according to the direction represented by the most recent pulse of said pulse trains.

34. The preconditioning circuit of claim 33 wherein said means for providing a clock input to said clock terminal comprises an AND GATE having first and second inputs respectively responsive to pulses of said first and second pulse trains and having an output coupled to said clock terminal.

35. The preconditioning circuit of claim 33 wherein said means for providing an input to said direction control terminal comprises a flip-flop having an output to said direction control terminal and having first and second control terminals for respectively setting the flip-flop into one state or another, pulses of said first pulse train being connected to said first control terminal of said flip-flop, and pulses of said second pulse train being connected to said second control terminal of said flip-flop.

36. In combination with a bi-directional counter having a clock terminal and a direction control terminal, and a sensing device that generates first and second trains of pulses which trains respectively denote mutually opposite directions of motion of a device sensed by such sensing device, a preconditioning circuit comprising:
an AND GATE having first and second inputs connected to receive said first and second pulse trains respectively and having an output coupled with said clock terminal, and
a flip-flop having an output connected to said direction control terminal and having first and second state controlling inputs connected to respectively receive pulses of said first and second pulse trains.

37. The combination of claim 14 wherein said means for tilting said rollers comprises a driven element connected to said rollers, a driver for driving the driven element, sensor means coupled with the driven element for generating a feedback signal indicative of motion of the driven element, command input means for generating a commanded position of the driven element, and first and second feedback path means for providing first and second independent feedback paths from said sensor and command means to said driver, said first feedback path comprising a first summing network having command and feedback inputs respectively responsive to said commanded position and said feedback signal and providing a first error signal, and processor means for processing said first error signal and having a first control signal output, said second feedback path comprising a second summing network having command and feedback inputs respectively responsive to said commanded position and said feedback signal, said second summing network providing a second control signal output, and means for selectively feeding said first or second control signal outputs to said driver.

38. The combination of claim 37 including an offset register adapted to receive said commanded position from said command input means and to provide an input to said command input of said second summing network.

39. The combination of claim 38 including means for selectively feeding either a function of said first control signal or said commanded position to said offset register.

40. The system of claim 28 wherein said feedback signal comprises first and second directional pulse trains, and including a bi-directional counter having an output connected to the feedback inputs of each of said first and second summing networks, having a clock terminal, and having a direction control terminal, and a preconditioning circuit connected between said counter and said sensing device, said preconditioning circuit comprising means responsive to both of said pulse trains for providing a clock input to said clock terminal in response to each pulse of each of said pulse trains, and means responsive to both of said pulse trains for providing a direction control input to said direction control terminal.

41. The combination of claim 37 wherein said feedback signal comprises first and second directional pulse trains, and including a bi-directional counter having a clock terminal, having a direction control terminal, and having an output connected to the feedback inputs of each of said first and second summing networks, and further including a preconditioning circuit connected between said counter and said sensing device, said preconditioning circuit comprising means responsive to both of said pulse trains for providing a clock input to said clock terminal in response to each pulse of each of said pulse trains, and means responsive to both of said pulse trains for providing a direction control input to said direction control terminal.

42. The control system of claim 28 wherein said means for selectively feeding comprises selector means for enabling said first feedback path and disabling said second feedback path while the driven element is moving toward a commanded position and for enabling said second feedback path and disabling said first feedback path when the driven element is substantially at said commanded position.

43. The control combination of claim 37 wherein said means for selectively feeding comprises selector means for enabling said first feedback path and disabling said second feedback path while the driven element is moving toward a commanded position and for enabling said second feedback path and disabling said first feedback path when the driven element is substantially at said commanded position.

* * * * *